United States Patent
Tsai et al.

(10) Patent No.: US 7,364,840 B2
(45) Date of Patent: Apr. 29, 2008

(54) CONTROLLED SHRINKAGE OF BILAYER PHOTORESIST PATTERNS

(75) Inventors: Feng-Yu Tsai, Goleta, CA (US); Jiun-Ting Lee, Santa Clara, CA (US)

(73) Assignee: Headway Technologies, Inc., Milpitas, CA (US)

( * ) Notice: Subject to any disclaimer, the term of this patent is extended or adjusted under 35 U.S.C. 154(b) by 613 days.

(21) Appl. No.: 10/771,482

(22) Filed: Feb. 3, 2004

(65) Prior Publication Data

US 2005/0170289 A1    Aug. 4, 2005

(51) Int. Cl.
*G03F 7/00* (2006.01)
(52) U.S. Cl. .................. 430/322; 430/312; 430/313; 430/328
(58) Field of Classification Search ............... 430/322, 430/328
See application file for complete search history.

(56) References Cited

U.S. PATENT DOCUMENTS

| | | | |
|---|---|---|---|
| 6,117,622 A * | 9/2000 | Eisele et al. | 430/328 |
| 6,274,025 B1 * | 8/2001 | Chang et al. | 205/118 |
| 6,340,556 B1 | 1/2002 | Wong | 430/296 |
| 6,348,301 B1 | 2/2002 | Lin | 430/330 |
| 6,576,405 B1 | 6/2003 | Buffat et al. | 430/322 |
| 6,582,889 B1 * | 6/2003 | Kamijima | 430/312 |
| 2003/0064326 A1 * | 4/2003 | Yamamoto et al. | 430/315 |

* cited by examiner

*Primary Examiner*—Mark F. Huff
*Assistant Examiner*—Caleen O. Sullivan
(74) *Attorney, Agent, or Firm*—Saile Ackerman LLC; Stephen B. Ackerman

(57) ABSTRACT

A technique is disclosed that combines a bilayered photoresist structure, similar to that which is already in use in the MR head industry, with a post development UV irradiation treatment which reduces the manufacturable feature-size to be below the resolution limit. The technique is compatible with current manufacturing processes, requires no additional investment, and can be extended to ultra-small feature sizes.

22 Claims, 4 Drawing Sheets

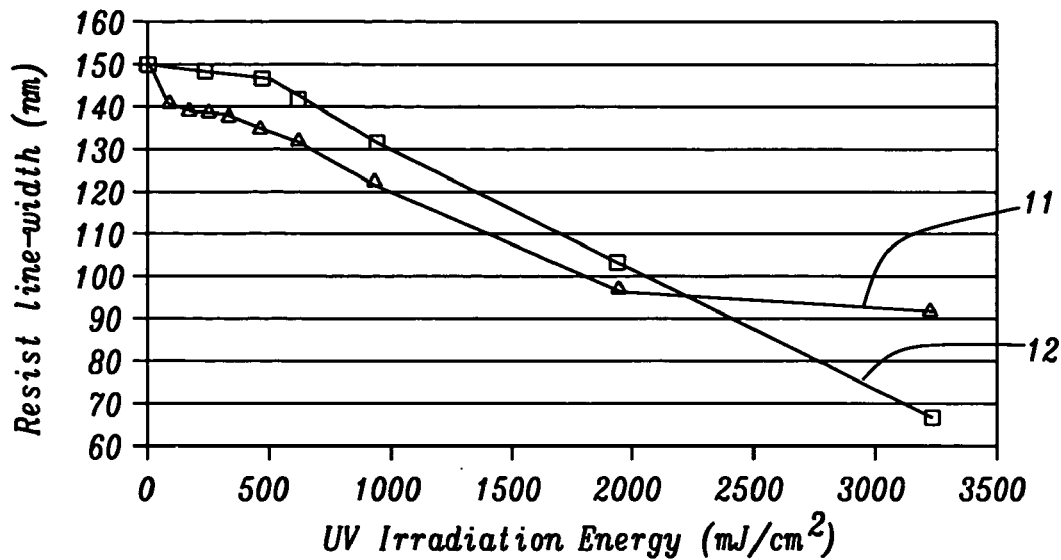
FIG. 1 — Prior Art
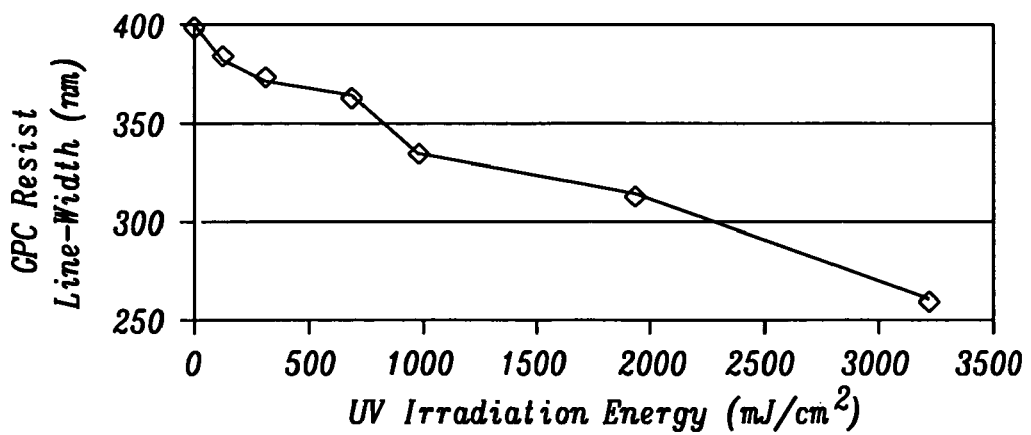
FIG. 2 — Prior Art

CONTROLLED SHRINKAGE OF BILAYER PHOTORESIST PATTERNS

FIELD OF THE INVENTION

The invention relates to the general field of photolithography with particular reference to post development treatment and CD reduction.

BACKGROUND OF THE INVENTION

With current KrF photolithography, it is difficult to achieve patterns in photoresist in which the critical dimension is below about 125 nm while retaining adequate manufacturing process latitude. In particular, the manufacture of magneto-resistive (MR) heads for high-density storage applications calls for ever decreasing dimensions of the reader/writer sensors which, in many cases, extend beyond the capability of current lithographic equipment, necessitating the incorporation of resolution-enhancement techniques such as phase shifting masks (PSM), optical proximity correction (OPC), and off-axis illumination.

These techniques, however, greatly increase process complexity and manufacturing cost in exchange for marginal reductions in the manufacturable feature size. Current lithographic equipment is capable of achieving a minimum feature-size of 180 nm while maintaining manufacturable process latitude. With the help of OPC and off-axis illumination the minimum size may reducible to 120 nm. Further reductions below 120 nm will require immense investment in PSM and/or next-generation lithographic tools.

Eisele et al. (U.S. Pat. No. 6,117,622) teach a technique that utilizes post-development UV irradiation and bake of chemically amplified photoresist patterns to shrink the resist features by up to 25%. Their technique, however, has limited practical value because 1. it shrinks the resist unevenly in a direction perpendicular to the substrate; i.e., the top of the resist shrinks to a much greater extent than the bottom, where the adhesion between the resist and substrate prevents effective shrinking;

2. it calls for a high-temperature bake, up to 230° C., after irradiation to flow the resist to achieve large shrinkage, which reduces the uniformity of resist dimensions and is often deleterious to the overall process; and 3. upon UV irradiation and bake, photoresists tend to become insoluble in stripping solutions, requiring additional aggressive resist-removal processes that greatly limit the applicability of their technique.

A routine search of the prior art was performed with the following references of interest being found:

In U.S. Pat. No. 6,348,301, Lin describes linear reduction of a PR mask using two baking steps. In U.S. Pat. No. 8,340,556, Wong discloses electron beam radiation to reduce line width of a pattern and, in U.S. Pat. No. 6,576,405, Buffat et al. teach UV exposure and post-exposure baking.

SUMMARY OF THE INVENTION

It has been an object of at least one embodiment of the present invention to provide an etch mask whose minimum width is less than the critical dimension of the optical projection system used in its formation.

Another object of at least one embodiment of the present invention has been to provide a process for manufacturing said etch mask.

Still another object of at least one embodiment of the present invention has been that said process be compatible with current MR head manufacturing processes.

A further object of at least one embodiment of the present invention has been that said process be cost effective, flexible, and extendible to future generations of MR heads.

These objects have been achieved by utilizing post-development UV irradiation of bilayered photo-resist patterns to controllably and uniformly shrink the resist. The technique does not involve high-temperature processing, and allows treated resists to be later removed by regular stripping process. Since bilayer structures are already in widespread use for patterning of MR structures, the invented process is fully compatible with existing manufacturing processes. Additionally, it is flexible, cost effective, and can be further engineered to accommodate future tighter specifications (of etched line width) as the state of the art advances.

BRIEF DESCRIPTION OF THE DRAWINGS

FIGS. 1 and 2 plot resist line width as a function of UV irradiation energy.

FIG. 6 shows a fuller view of the mask structure of which FIG. 5 is a part.

DESCRIPTION OF THE PREFERRED EMBODIMENTS

Figure 3B:
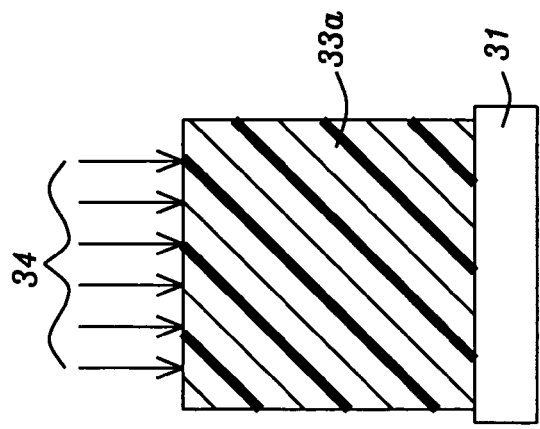
FIGS. 3B and 4B illustrate deteriorated and undesirable resist profiles.

The present invention embodies three novel features that, together, overcome the prior art problems discussed earlier:

1. Non-thermal densification of chemically amplified photoresist through post development UV irradiation 2. Addition of an under-layer, impervious to UV irradiation, to facilitate later stripping of the resist 3. Selection of an under-layer with rapid dissolution rate in the developer solution whereby cantilevered edges for the resist are created so that it can shrink without constraint and hence not change its shape.

We now elaborate further on these features, as follows:

1. Densification of resist:

Chemically amplified resists densify upon post-development UV irradiation due to two speculative mechanisms:

i. Thermal densification: UV irradiation activates photo-acid generators (PAG) which, when subjected to a subsequent bake, de-protect the photo-resist resin attached by solution-inhibiting side groups. The removal of these side groups facilitates denser packing of the polymer chains of the resin, resulting in a reduction in the resist volume.

ii. Non-thermal densification: UV irradiation ruptures chemical bonds of the resist components and creates free radicals, which cross-links the polymer chains of the resist, causing additional densification. These two mechanisms illustrated in FIG. 1 where resist line-width changes with post-development UV irradiation are compared for two cases: (a) bake at 120° C. for 240 seconds after UV irradiation (curve 11), and (b) no bake (curve 12). When applying UV radiation energy lower than ~500 mJ/cm$^2$, there was little resist shrinkage in the no-bake case, indicating that the shrinkage mechanism was dominated by thermal densification, as mentioned in (i). As UV irradiation energy was increased above 500 mJ/cm², the difference between (a) and (b) diminished, indicating that a non-thermal mechanism was dominating, as described in (ii).

A change in the shrinkage mechanism at ~500 mJ/cm² was confirmed in a separate experiment where it was found that developed resist irradiated with energy higher than 500 mJ/cm² became insoluble in hot NMP stripping solution, evidence of its being cross-linked. The process details are as follows: Resist: I-801 by Shin-Etsu, Thickness: 0.24 microns; Under-layer: LOL-1000 by Shipley, Thickness: 72 nm; UV exposure tool: F300S power supply and LC-6B conveyer by Fusion UV Systems Co.; Wavelength range of UV illumination: 200 to 400 nm. It should be noted that similar shrinkage behavior was also observed with a different chemically amplified photo-resist: UV210 (0.5 microns) by Shipley, as shown in FIG. 2, demonstrating that the post development treatment is effective in reducing the resist line width regardless of resist vendor and type.

2. Addition of the under-layer:

Addition of an under-layer to the photoresist film overcame the two critical drawbacks of the above-mentioned prior art resist-shrinking technique: (1) resist becomes unstrippable, and (2) resist profile changes upon extended UV irradiation.

Selection criteria for the under-layer include (1) the under-layer must be soluble in stripping solutions, and (2) the under-layer must possess higher solubility than the exposed resist in developer solutions. Although, strictly speaking, the underlayer is not developed in the same sense as the photoresist, it is convenient to refer to it as developing at a faster rate than the photoresist.

Three materials that were found suitable for the underlayer: were polymethyl-glutarimide (PMGI) (provided by resist manufacturers such as Shipley), developable bottom anti-reflective coating materials such as KrF (D01 series resist manufactured by Clariant), and wet developable bottom anti-reflective coating materials such as IMBARC (manufactured by Brewer Science, Inc.), but it will be understood that other materials having similar properties could have been used instead. The under-layer was spin-coated onto substrates (typically silicon wafers) followed by resist coating, also by spin coating, although deposition methods other than spin coating could have been used without changing the final result.

Figure 3A:
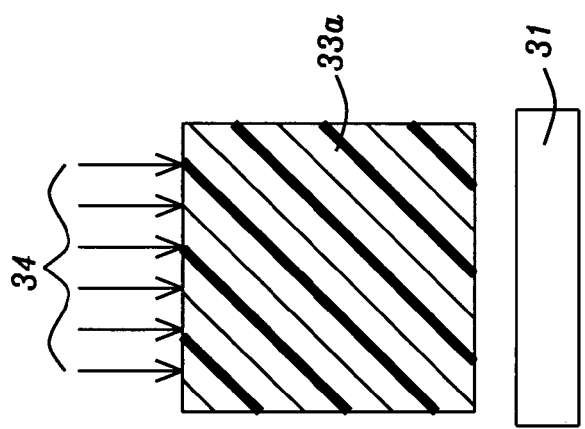
FIGS. 3A and 4A illustrate the case where the underlayer is completely removed.
Figure 3:
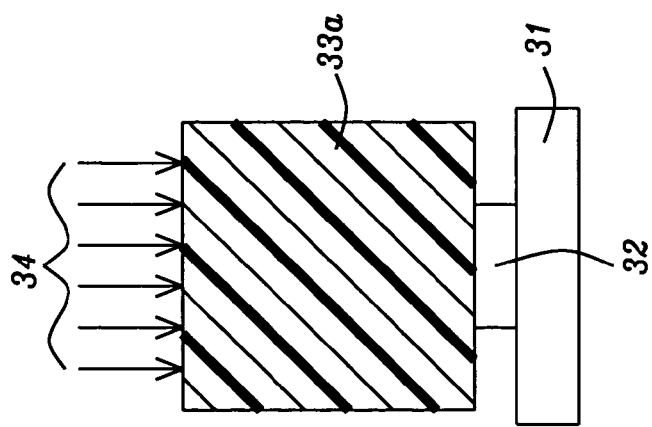
FIGS. 3 and 4 are schematic cross-sections to illustrate the key steps of the process of the present invention.

FIG. 3 is a schematic cross-section showing the bilayer structure after development but prior to post development UV irradiation. After underlayer 32 had been deposited onto substrate 31, photoresist layer 33a was laid down and the system exposed using a suitable imaging system in the usual way. Following exposure, the development time was tuned to dissolve away enough of the under-layer to create the cantilevered overhang (typically between about 0.01 and 0.25 microns) seen in the figure. The structure was then exposed to UV radiation 34 in the manner discussed earlier.

Note that photoresist (33b), after ultraviolet treatment, does not necessarily shrink to the same dimension as the underlayer 32 although an undercut is still kept in most cases to facilitate the subsequent liftoff process, the resist dimension still being larger than the underlayer. After ultraviolet treatment, the resist acts as the etching mask of the substrate, and the underlayer helps stripping.

The width of layer 32 can sometimes even reduce to zero, so that the resist actually ends up suspended in air. (see FIGS. 3A and 4A) supported by other, much larger, patterns (as in FIG. 6), which do not get fully undercut. When the resist is suspended, additional advantages to the process accrue since, during ultraviolet exposure, the resist can shrink without any constraint, and can thus more easily retain its original rectangular shapes.

In comparison, applying ultraviolet treatment to the resist without including an underlayer can result in a slanted sidewall to the resist. During ultraviolet exposure, the top of the resist can shrink freely while the bottom of the resist is confined to the interface with the substrate. As shown in FIGS. 3B and 4B, the resist profile after shrinkage has deteriorated and is undesirable.

Figure 4:
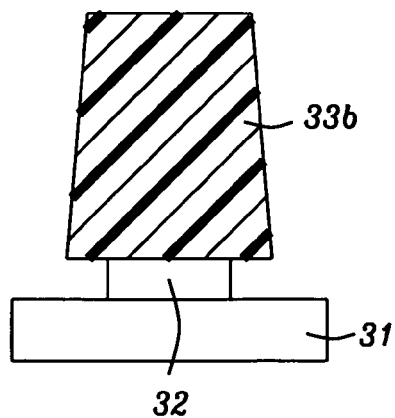
Figure 4A:
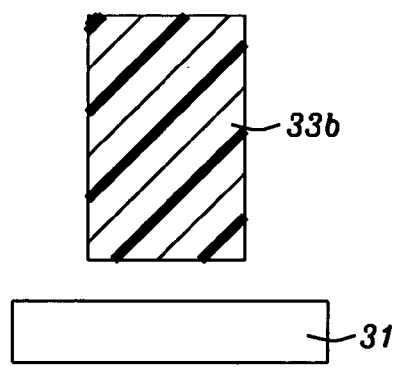
Figure 4B:
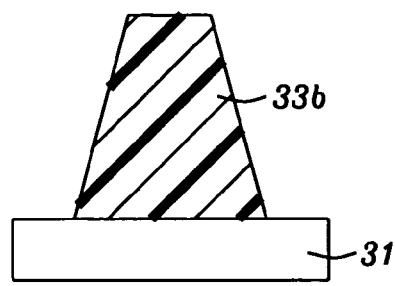

FIG. 4 shows how resist layer 33a of FIG. 3 has shrunk as a result of the post development irradiation to become resist layer 33b which is suitable for use as a surface mask.

Figure 5:
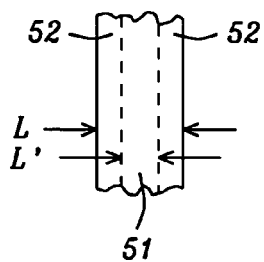
FIG. 5 is a plan view of the structure seen in FIG. 3.
Figure 6:
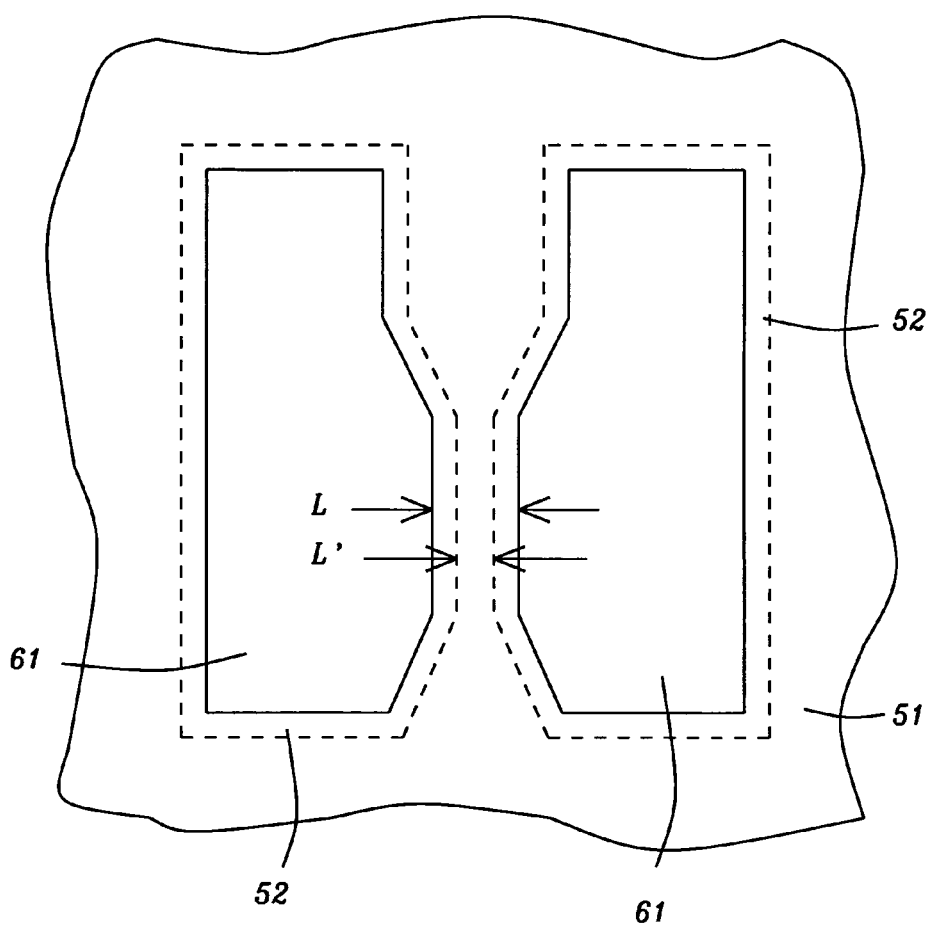

FIG. 5 is a plan view of FIG. 3 showing that the original photoresist line feature had a width of L which could be no smaller than the CD of the pattern (typically about 0.2 microns). After development, under-layer 51 (32 in FIG. 3) had been reduced to a width of L' so that it was overhung by the photoresist by an amount 52 (typically between about 0.01 and 0.25 microns), said overhang being later reduced or eliminated through shrinkage following further UV exposure. FIG. 6 shows a fuller picture of the photoresist mask of which FIG. 5 is a part. Here, photoresist layer 51 overlies thin film layer 61. After etching, a line feature, whose width is less than the CD, will have been formed. A typical structure of this type would be a UV210 resist, about 0.5 microns thick with a 72-nm PMGI underlayer.

Cantilevering the resist line not only allowed it to shrink uniformly in the vertical direction, but also maintained the line-width uniformity across the wafer. With this bi-layer structure, the average 3-sigma over the mean line-width was maintained at ~5% before and after UV irradiation, while it increased to ~30% upon irradiation when there was no under-layer. The irradiated resist was lifted off by dissolving the under-layer in regular stripping solutions such as NMP.

The overall process flow of the resist-shrinking technique presented above features the following advantages:

1. Compatibility: Bilayered resist structure are widely used in the manufacturing of MR heads so the present invention is fully compatible with current MR head manufacturing processes. It should be noted, however, that the bilayer structures that are currently in use are for the purpose of forming patterns through liftoff, so the composition, thickness and etch characteristics of the under-layers of the present invention will be different.

2. Cost effectiveness: The present invention requires UV illumination tools, which are already in widespread use by the industry. So no additional equipment is needed.

3. Flexibility: The post-development UV irradiation can be applied to any layers compatible with the bilayered resist structure to reduce feature-size and improve uniformity.

4. Extendability: The post-development UV irradiation is capable of further size reductions of up to 60% when future equipment/process upgrades realize smaller features.

What is claimed is:

1. A method to form an etch mask, comprising
providing a substrate and depositing thereon an under-layer of a lithographic material that, after development, is dimensionally unaffected by exposure to ultraviolet radiation;
depositing, on said under-layer, a layer of photoresist having a development rate that is slower than that of said under-layer;
exposing both of said layers to radiation whereby a latent image is formed;

developing both layers whereby said under-layer has a smaller developed image than does said photoresist layer and whereby said layer of photoresist overhangs said under-layer, extending outwards therefrom as a horizontal cantilever; and then exposing both layers to ultraviolet radiation alone, with no heat being applied, whereby said photoresist layer shrinks uniformly in all directions, including normal to said substrate, thereby continuing to extend outwards therefrom as a horizontal cantilever, while said under-layer remains dimensionally unchanged, thereby forming said etch mask.

2. The method described in claim 1 wherein said under-layer of a lithographic material is selected from the group consisting of polymethyl-glutarimide, developable bottom anti-reflective coating materials, and wet-developable bottom anti-reflective coating materials.

3. The method described in claim 1 wherein said under-layer of a lithographic material is deposited to a thickness between about 0.001 and 0.3 microns.

4. The method described in claim 1 wherein said under-layer of a lithographic material is deposited by means of spin coating.

5. The method described in claim 1 wherein said layer of photoresist is a positive photoresist.

6. The method described in claim 1 wherein said layer of photoresist is a negative photoresist.

7. The method described in claim 1 wherein said layer of photoresist is deposited to a thickness between about 0.05 and 1 microns.

8. The method described in claim 1 wherein said layer of photoresist is deposited by means of spin coating.

9. The method described in claim 1 wherein the step of exposing both layers to ultraviolet radiation after development further comprises exposing at an irradiation level between about 500 and 10,000 mJ/cm$^2$ of radiation in a wavelength range between about 200 and 400 nm.

10. The method described in claim 1 wherein said photoresist developed image, prior to exposure to additional ultraviolet radiation, is between about 20 and 500 nms wider than said under-layer developed image.

11. A process to form, through etching, a line whose width is less than a critical dimension of an imaging system, comprising:

providing a first layer of a material that is to be etched;

depositing on said first layer a second layer of a lithographic material that, after development, is dimensionally unaffected by exposure to ultraviolet radiation;

depositing, on said second layer, a layer of photoresist having a development rate that is slower than that of said second layer;

through said imaging system, exposing said layers to radiation whereby a latent image having a first minimum width is formed;

developing the photoresist and the second layer for a period of time whereby said under-layer is transformed into a developed image that is uniformly smaller than that into which said photoresist layer is transformed;

exposing both developed images to ultraviolet radiation alone, with no heat being applied, whereby said photoresist layer shrinks uniformly in all directions, while said second layer remains dimensionally unchanged, thereby enabling said layer of photoresist to overhang said under-layer and extend outwards therefrom as a horizontal cantilever and thereby forming a contact mask having a second minimum width that is less than said first minimum width;

using said contact mask, subtractively etching said first layer; and then selectively removing said photoresist layer and said second layer.

12. The process as recited in claim 11 wherein said under-layer of a lithographic material is selected from the group consisting of polymethyl-glutarimide, developable bottom anti-reflective coating materials, and wet-developable bottom anti-reflective coating materials.

13. The process recited in claim 11 wherein said second layer of a lithographic material is deposited to a thickness between about 0.001 and 0.3 microns.

14. The process recited in claim 11 wherein said second layer of a lithographic material is deposited by means of spin coating.

15. The process recited in claim 11 wherein said layer of photoresist is a positive photoresist.

16. The process recited in claim 11 wherein said layer of photoresist is a negative photoresist.

17. The process recited in claim 11 wherein said layer of photoresist is deposited to a thickness between about 0.05 and 1 microns.

18. The process recited in claim 11 wherein said layer of photoresist is deposited by means of spin coating.

19. The process recited in claim 11 wherein the step of exposing both layers to ultraviolet radiation after development further comprises exposing at an irradiation level between about 500 and 10,000 mJ/cm$^2$, of radiation in a wavelength range between about 200 and 400 nm.

20. The process recited in claim 11 wherein said first minimum width is between about 0.02 and 0.5 microns.

21. The process recited in claim 11 wherein said second minimum width is between about 0.02 and 0.5 microns.

22. The process recited in claim 11 wherein the step of selectively removing said photoresist layer and said second layer further comprises stripping in NMP at a temperature between about 20 and 80% C for about 5 to 120 minutes.

* * * * *